United States Patent [19]

Schuller et al.

[11] Patent Number: 5,432,149
[45] Date of Patent: Jul. 11, 1995

[54] IN-SITU TUNABLE JOSEPHSON WEAK LINKS

[75] Inventors: Ivan K. Schuller, San Diego, Calif.; Gladys L. Nieva; Julio J. Guimpel, both of Bariloche, Argentina; Eduardo Osquiguil, Kessel-Lo; Yvan Bruynseraede, Linden, both of Belgium

[73] Assignee: Regents of the University of California, Oakland, Calif.

[21] Appl. No.: 225,076

[22] Filed: Apr. 8, 1994

Related U.S. Application Data

[63] Continuation of Ser. No. 901,754, Jun. 22, 1992, abandoned.

[51] Int. Cl.[6] .............................................. H01L 39/24
[52] U.S. Cl. .................................. 505/329; 505/325; 505/480; 505/702; 505/701; 427/62; 427/63; 257/34
[58] Field of Search ............... 505/190, 329, 325, 701, 505/702, 480; 427/62, 63, 596, 126.3; 257/34

[56] References Cited

PUBLICATIONS

Robbes et al, "Josephson Weak Links in Thin Films of $YBa_2Cu_3O_{7-x}$ Induced by Electrical Pulses", Appl. Phys. Lett. 56(22) May 1990, pp. 2240–2242.

Yoshida et al, "Monolithic Device Fabrication using High–Tc Superconductor", International Electron Devices Meeting (Sanfancisco, Calif.) Dec. 11–14, 1988 pp. 282–285.

Nieva et al., "Photoinduced Enhancement of Superconductivity" Appl. Phys. Lett. 60(17) Apr. 1992 pp. 2159–2161.

"Superconductivity—The State That Came in from the Cold", T. H. Geballe et al., Science, vol. 239, pp. 367–374, Jan. 22, 1988.

"Transient Photoinduced Conductivity in Semiconducting Single Crystals of $YBa_2Cu_3O_{6.3}$: Search for Photoinduced Metallic State and for Photoinduced Superconductivity", G. Yu et al., Solid State Communications, vol. 72, No. 4, pp. 345–349, 1989.

"Dependence of Photoinduced Superconductivity on Illumination Dose in $YBa_2Cu_3O_{6.4}$ Films", V. I. Kudinov et al., Physics Letters A, vol. 157, No. 4.5, pp. 290–294, Jul. 29, 1991.

"Controlled Preparation of Oxygen Deficient $YBa_2Cu_3O_x$ Films", E. Osquiguil et al., Appl. Phys. Lett., 60 (13), pp. 1627–1629, Mar. 30, 1992.

Primary Examiner—Roy V. King
Attorney, Agent, or Firm—Brown, Martin, Haller & McClain

[57] ABSTRACT

A weak link is patterned from a high-temperature superconducting film using standard lithographic techniques. Once the area in which the weak link is to be located is defined, the remainder of the film is covered with an oxygen-impermeable material. The oxygen is then removed in the weak link area by placing the sample in a vacuum furnace at a sufficient temperature to drive out the oxygen. Once the oxygen is removed, the weak link becomes non-superconducting. A high power solid state laser is placed in front of the weak link, and superconductivity is restored in the weak link area, in situ. The process is performed in a liquid nitrogen environment.

12 Claims, 1 Drawing Sheet

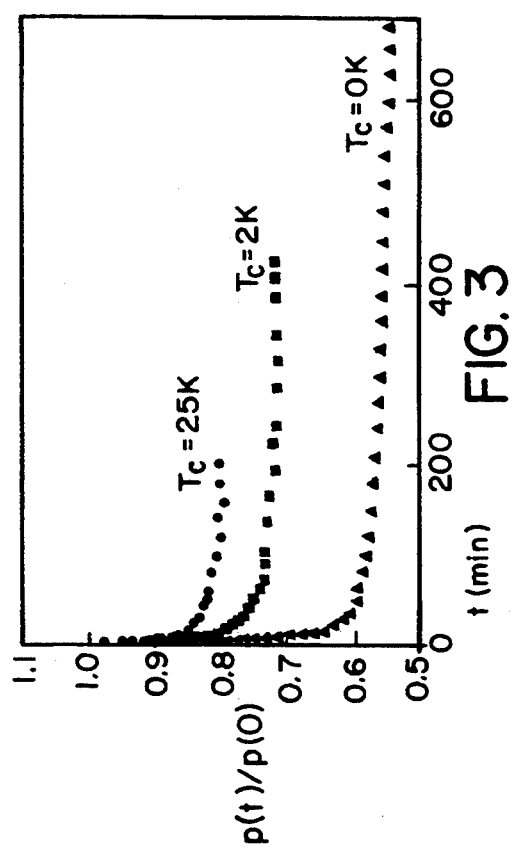
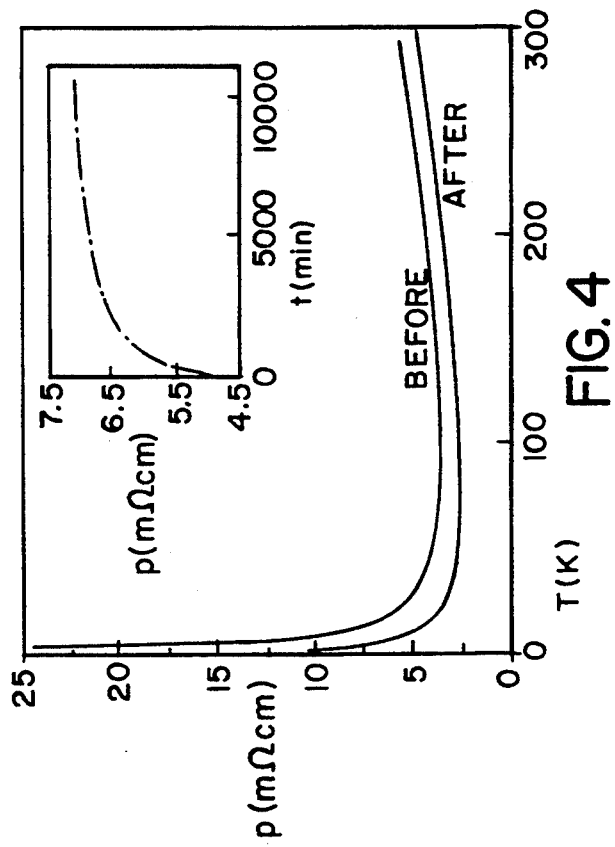
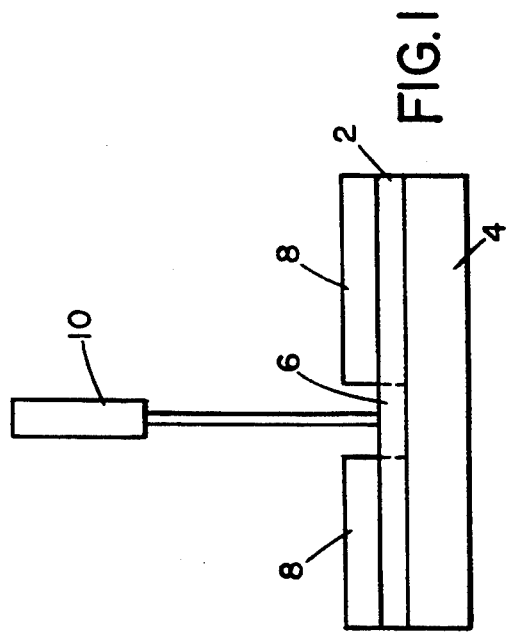
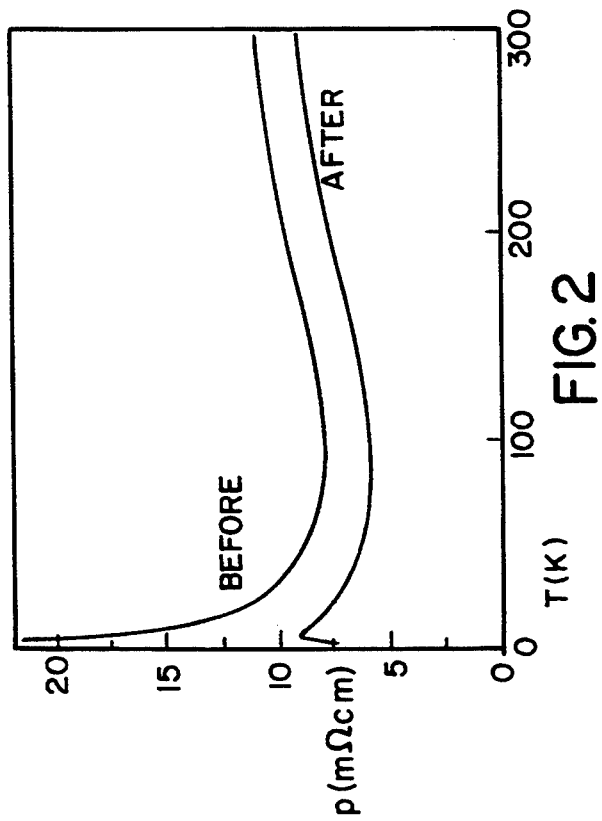

IN-SITU TUNABLE JOSEPHSON WEAK LINKS

This invention was made with Government support under Contract No. N00014-91-J-1438, awarded by the Office of Naval Research. The Government has certain rights in this invention.

This application is a continuation of application Ser. No. 07/901,754, filed Jun. 22, 1992 now abandoned.

BACKGROUND OF THE INVENTION

Recently, compounds have been discovered which, in certain phases, become superconducting at or above 90° K. This immediately makes these compounds, labelled "high $T_c$", much more practical for use, since previous superconductors required cooling by liquid helium (~4° K.). The high $T_c$ materials can be cooled to their critical temperature by liquid nitrogen (~77° K.), which is easier to handle and considerably less costly.

Several uses of superconducting electronic devices depend on Josephson weak links. In such devices, if two superconductors are connected together through a weak link, such as a thin oxide barrier current can flow by tunneling through the barrier without any voltage. Josephson-effect weak links are used as SQUIDs (superconducting quantum interference devices) and for digital switches. While SQUID magnetometers are well known at lower critical temperatures ($T_c$), on the order of 4° K., difficulties have been encountered in reliably forming SQUIDs and other Josephson-effect based devices using the high $T_c$ materials developed in recent years. Nonetheless, it would be desirable to apply high $T_c$ materials to these devices to make the devices more practical, enabling relatively widespread use.

A considerable amount of work has been devoted to the development of high $T_c$ materials which possess sufficient reliability to permit their incorporation into electronic devices. Early work in high $T_c$ copper oxides, including $YBa_2Cu_3O_x$ (YBCO) films, indicated that high temperature (850° K.) annealing was required to stabilize the oxygen content within the sample. The requirement of a high-temperature treatment would introduce considerable difficulty in fabrication of superconducting interconnects.

Another drawback of many of the high $T_c$ superconductors is that they have very short coherence lengths, on the order of nanometers, which places them beyond the capabilities of current photolithographic techniques. Therefore, other means for shaping and activating the junctions must be determined.

It has been shown that prolonged exposure of $YBa_2Cu_3O_x$ films to visible light enhances the compound's superconductive properties (see, e.g., V. I. Kudinov, et al., "Dependence of Photo-Induced Conductivity on Illumination Dose in $YBa_2Cu_3O_{6.4}$ Films", Phys. Lett. A, V 157, N. 4.5, pp. 290–294). The photoexcitation of $YBa_2Cu_3O_x$ (YBCO) reduces the resistivity of the material, and the effect persists for long times, on the order of days.

It would be desirable to incorporate the photoexcitability of high $T_c$ films for the purpose of fabricating reproducible and reliable Josephson weak links. It is to such a purpose that the present invention is directed.

SUMMARY OF THE INVENTION

In an exemplary embodiment, a weak link is patterned from a high-temperature superconducting film such as $YBa_2Cu_3O_x$ (YBCO), $GdBa_2Cu_3O_x$ (GdBCO) or any other rare earth in combination with $Ba_2Cu_3O_x$ ($REBa_2Cu_3O_x$, where RE is any rare earth element other than yttrium, or REBCO for short) using standard lithographic techniques, down to a size of about 2,000Å. Once the area in which the weak link is to be located is defined, the remainder of the film is covered with an oxygen-impermeable material such as gold, platinum, palladium, niobium, etc. The oxygen is then removed in the weak link area by placing the sample in a vacuum furnace and heating to a sufficient temperature to liberate the oxygen. Once the oxygen is removed, the weak link becomes non-superconducting. A high power solid state laser is placed in front of the weak link, and superconductivity is restored in the weak link area, in situ, by irradiating the weak link with the laser, thus permitting current flow between the areas that were separated by the weak link. The process is performed in a liquid nitrogen environment. The weak link properties can be maintained for indefinite periods of time by periodically irradiating the weak link junction with the laser.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which:

FIG. 1 is a diagrammatic view of a Josephson weak link according to the present invention;

FIG. 2 is a plot of resistivity versus temperature for a GdBCO film before and after illumination;

FIG. 3 is a plot of resistivity ratio with time during illumination; and

FIG. 4 is a plot of temperature versus resistivity for a YBCO film before and after illumination with an inset showing relaxation to the initial state after illumination.

DETAILED DESCRIPTION OF THE PREFERRED EMBODIMENT

As illustrated in FIG. 1, a Josephson weak link is fabricated by epitaxial growth of a high $T_c$ film 2 on a substrate 4. In the experiments to develop the present invention, the substrate was either $SrTiO_3$ or MgO. The portion of the film which is to be the weak link 6 is defined by standard lithographic techniques to mask it during deposition of an oxygen-impermeable material 8 over the rest of the device. (In the alternative, the oxygen-impermeable material is deposited over the film then selectively removed from the weak link area.) The oxygen-impermeable material 8 can be an inert metal such as gold, platinum, palladium, niobium, etc. The masking material is removed, and the oxygen is removed from the weak link area 6 by placing the sample in a vacuum furnace and heating it to a sufficient temperature to liberate the oxygen from the film. Once the oxygen is removed, the weak link 6 becomes non-superconducting. A laser 10 is placed in front of the weak link 6 to irradiate the weak link area 6 in situ. In the preferred embodiment, a high power solid state laser is used for its compactness, but gas lasers and other light sources may be used.

The processing details of the weak link during laboratory tests were as follows: High quality YBCO and GdBCO epitaxial films were prepared by in-situ sputtering methods on substrates of $SrTiO_3$ and MgO. The films were prepared at approximately 650° C. in a mixture of argon and oxygen, then cooled to room temperature-through an, oxygen doping sequence. It should be noted that other rare earth elements may be used in place of the yttrium or gadolinium.

The YBCO oxygen-deficient sample was prepared by thermal treatment in an oxygen-controlled environment. (One such method is described by E. Osquiguil, et al., "Controlled preparation of oxygen deficient $YBa_2Cu_3O_x$ films", *Appl. Phys. Lett.* 60 (13), 30 Mar. 1992.) In the present process, the treatment consists of annealing the sample at 10 Torr oxygen pressure ($P_{o2}$) and a temperature corresponding to the desired oxygen content line in the $P_{o2}$-T phase diagram. Following the annealing step, the sample is slowly cooled through the desired oxygen content line on the $P_{o2}$-T (oxygen pressure-temperature) phase diagram. The controlled cooling is followed by a rapid quench to room temperature from approximately 350° C. In this fashion, high $T_c$ films of desired oxygen stoichiometry with narrow transition widths are reproducibly obtained. Laser irradiation was done using an argon ion laser with a series of lines in the 454.5 nm $\leq \lambda \leq$ 514.5 nm range with a total power of 6 watts. The samples were immersed in liquid nitrogen during irradiation and the change in resistivity was measured in situ during photoexcitation. Contacts to the sample were made with sputtered silver electrodes. The amount of heating during irradiation was minimal as indicated by the absence of abrupt changes in the sample resistivity after the laser was turned off. After the illumination, the relaxation of the resistance was measured at room temperature.

FIG. 3 shows the time evolution under laser illumination of the 77° K. normal state resistivity for 3–100 nm thick YBCO samples on MgO—one with a nominal oxygen stoichiometry x=6.5 and no detectable $T_c$ down to 1.5° K. (identified as $T_c$=0° K.), one with x=6.55 and a zero resistance critical temperature $T_c$=2° K., and one with x=6.6 and $T_c$=25° K. All three samples show an initial rapid decrease in the resistivity in 10–20 minutes, followed by a saturation plateau. The more metallic the sample, the smaller the relative change in the resistivity. FIG. 4 illustrates the temperature-dependent resistivity of the YBCO insulating sample ($T_c$=0° K.), before and after irradiation. The resistivity decreases throughout the entire temperature range, the change being an almost temperature-independent shift above approximately 50° K. The inset shows the relaxation at room temperature after the illumination. FIG. 5 shows the change in the resistivity of the $T_c$=2° K. sample. Again, the shift in the resistivity is a parallel shift above approximately 50° K. and a reduction of the "semiconductor-like" behavior towards a "metallic" temperature dependence below approximately 50° K. The inset shows the superconducting transition before and immediately after illumination, in an expanded scale. In each case, the superconducting transition is enhanced to higher temperatures, with the change being well outside the transition width and, consequently, independent of the $T_c$ definition. After six days in air at room temperature, $T_c$ relaxes back to its original value within less than 1° K. However, the magnitude of the resistivity relaxes to a higher value than its initial value. After this relaxation, a second photoexcitation of the same film produces an identical $T_c$ enhancement.

While the relaxation of $T_c$ can take several days, a more convenient fashion for maintaining the high $T_c$ would be to use in-situ solid state lasers to maintain the desired properties for long periods of time. Gas lasers or other light sources may also be used.

The above-described method for fabrication of Josephson junctions provides a reliable means using high $T_c$ superconductors which do not require cooling below the levels of which liquid nitrogen is capable. The superconducting behavior is controllable and repeatable, and can be maintained for indefinite periods of time. The technique of forming weak links provides reliable junctions which can be applied to devices currently dependent upon lower $T_c$ superconductors, as well as making superconducting devices practical for other applications.

It will be evident that there are additional embodiments which are not illustrated above but which are clearly within the scope and spirit of the present invention. The above description and drawings are therefore intended to be exemplary only and the scope of the invention is to be limited solely by the appended claims.

We claim:

1. A method for fabricating sustainable Josephson junctions which comprises:
    defining an area within a high $T_c$ superconducting film on a substrate;
    defining a sub-area of said area wherein said sub-area bisects said area separating a first portion of said area from a second portion of said area;
    protecting said first portion and said second portion with an oxygen-impermeable material;
    heating said substrate whereby at least a portion of oxygen is driven out of said sub-area so that said sub-area is non-superconducting;
    cooling said substrate in a controlled manner through a pre-selected oxygen content line on an oxygen pressure-temperature phase diagram;
    quenching said substrate to room temperature at a rapid rate relative to the cooling step;
    subjecting said substrate to a liquid nitrogen environment; and
    illuminating said sub-area with a laser to restore superconductivity to said sub-area.

2. A method as in claim 1 wherein said film is REBCO.

3. A method as in claim 2 wherein said film is YBCO.

4. A method as in claim 1 wherein the step of defining an area comprises defining said area using photolithographic techniques.

5. A method as in claim 1 wherein the step of illuminating said area comprises illuminating said area with a solid state laser.

6. A method as in claim 1 wherein the step of illuminating said area comprises illuminating said area with a gas laser.

7. A method for fabricating a weak link in superconducting devices which comprises:
    defining an area within an oxygen-containing high $T_c$ superconducting film which bisects said superconducting film;
    heating said superconducting film to drive oxygen out of said area so that said area is no longer superconducting;
    controlled cooling said superconducting film through a pre-selected oxygen content line on an oxygen pressure-temperature phase diagram;
    quenching said superconducting film to room temperature at a rapid rate relative to the controlled cooling step;
    immersing said superconducting film in liquid nitrogen; and illuminating said area with a laser so that superconductivity is restored to said area.

8. A method as in claim 7 wherein said superconducting film is REBCO.

9. A method as in claim 8 wherein said superconducting film is YBCO.

10. A method as in claim 7 wherein the step of defining an area comprises defining said area using photolithographic techniques.

11. A method as in claim 7 wherein the step of illuminating said area comprises illuminating said area with a solid state laser.

12. A method as in claim 7 wherein the step of illuminating said area comprises illuminating said area with a gas laser.

* * * * *